(12) United States Patent
Brown et al.

(10) Patent No.: US 11,699,476 B2
(45) Date of Patent: Jul. 11, 2023

(54) APPARATUSES AND METHODS FOR MONITORING WORD LINE ACCESSES

(71) Applicant: MICRON TECHNOLOGY, INC., Boise, ID (US)

(72) Inventors: Jason M. Brown, Allen, TX (US); Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 17/375,817

(22) Filed: Jul. 14, 2021

(65) Prior Publication Data

US 2021/0343324 A1    Nov. 4, 2021

Related U.S. Application Data

(63) Continuation of application No. 16/459,520, filed on Jul. 1, 2019, now Pat. No. 11,139,015.

(51) Int. Cl.
| | | |
|---|---|---|
| *G11C 11/00* | (2006.01) | |
| *G11C 11/406* | (2006.01) | |
| *G11C 11/408* | (2006.01) | |

(52) U.S. Cl.
CPC ........ *G11C 11/406* (2013.01); *G11C 11/4087* (2013.01)

(58) Field of Classification Search
CPC .............. G11C 11/4087; G11C 11/406; G11C 11/40611; G11C 11/4085; G11C 11/408; G11C 11/40603; G11C 11/4078; G11C 11/40607; G11C 11/407; G11C 11/4076; G11C 29/783; G11C 29/52; G11C 2029/1202; G11C 29/20; G11C 29/42; G11C 29/44; G11C 7/065; G11C 11/1657; G11C 11/40615; G11C 16/349; G11C 2029/0411; G11C 7/24; G11C 8/08;

(Continued)

(56) References Cited

U.S. PATENT DOCUMENTS

| | | |
|---|---|---|
| 3,633,175 A | 1/1972 | Harper |
| 5,291,198 A | 3/1994 | Dingwall et al. |
| 5,299,159 A | 3/1994 | Balistreri et al. |

(Continued)

FOREIGN PATENT DOCUMENTS

| | | |
|---|---|---|
| CN | 1144434 A | 3/1997 |
| CN | 1195173 A | 10/1998 |

(Continued)

OTHER PUBLICATIONS

US 11,264,075 B2, 03/2022, Bell et al. (withdrawn)

(Continued)

*Primary Examiner* — Thong Q Le
(74) *Attorney, Agent, or Firm* — Dorsey & Whitney LLP

(57) ABSTRACT

An apparatus may include multiple memory devices. Each memory device may include multiple memory banks. Addresses of accessed word lines for a particular portion of memory and the number of times those word lines are accessed may be tracked by each memory device. When a memory device determines that an accessed word line is an aggressor word line, the memory device alerts other memory devices of the apparatus. The memory devices may then perform targeted refresh operations on victim word lines of the aggressor word line.

20 Claims, 7 Drawing Sheets

(58) Field of Classification Search
CPC ............ G11C 11/40622; G11C 8/16; G11C 11/40618; G11C 15/04; G11C 5/04
See application file for complete search history.

(56) References Cited

U.S. PATENT DOCUMENTS

| | | | |
|---|---|---|---|
| 5,422,850 A | 6/1995 | Sukegawa et al. |
| 5,638,317 A | 6/1997 | Tran |
| 5,699,297 A | 12/1997 | Yamazaki et al. |
| 5,768,196 A | 6/1998 | Bloker et al. |
| 5,933,377 A | 8/1999 | Hidaka |
| 5,943,283 A | 8/1999 | Wong et al. |
| 5,970,507 A | 10/1999 | Kato et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,515,928 B2 | 2/2003 | Sato et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,283,380 B1 | 10/2007 | Srinivasan et al. |
| 7,304,875 B1 | 12/2007 | Lien et al. |
| 7,319,602 B1 | 1/2008 | Srinivasan et al. |
| 7,444,577 B2 | 10/2008 | Best et al. |
| 7,551,502 B2 | 6/2009 | Dono et al. |
| 7,565,479 B2 | 7/2009 | Best et al. |
| 7,830,742 B2 | 11/2010 | Han |
| 7,870,362 B2 | 1/2011 | Hong et al. |
| 7,872,907 B2 | 1/2011 | Okayama et al. |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,676,725 B1 | 3/2014 | Lin et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,554 B1 | 7/2015 | Park |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 2/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,847,118 B1 | 12/2017 | Won |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,446,216 B2 | 10/2019 | Oh et al. |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,705,900 B2 | 7/2020 | Jin |
| 10,770,127 B2 | 9/2020 | Shore et al. |
| 10,811,066 B2 | 10/2020 | Jones et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,930,335 B2 | 2/2021 | Bell et al. |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 11,011,215 B1 | 5/2021 | Parry et al. |
| 11,043,254 B2 | 6/2021 | Enomoto et al. |
| 11,139,015 B2 | 10/2021 | Brown et al. |
| 11,152,050 B2 | 10/2021 | Morohashi et al. |
| 11,158,364 B2 | 10/2021 | Penney et al. |
| 11,158,373 B2 | 10/2021 | Penney et al. |
| 11,200,942 B2 | 12/2021 | Jenkinson et al. |
| 11,222,682 B1 | 1/2022 | Enomoto et al. |
| 11,257,535 B2 | 2/2022 | Shore et al. |
| 11,264,096 B2 | 3/2022 | Schreck et al. |
| 11,322,192 B2 | 5/2022 | Morohashi et al. |
| 11,361,808 B2 | 6/2022 | Bell et al. |
| 11,386,946 B2 | 7/2022 | Ayyapureddi et al. |
| 11,398,265 B2 | 7/2022 | Wu et al. |
| 11,424,005 B2 | 8/2022 | Penney et al. |
| 11,462,291 B2 | 10/2022 | Pan |
| 11,482,275 B2 | 10/2022 | Ayyapureddi et al. |
| 11,521,669 B2 | 12/2022 | Enomoto et al. |
| 11,568,918 B2 | 1/2023 | Ayyapureddi et al. |
| 11,600,314 B2 | 3/2023 | Ayyapureddi et al. |
| 11,600,326 B2 | 3/2023 | Schreck et al. |
| 2001/0008498 A1 | 7/2001 | Ooishi |
| 2002/0007476 A1 | 1/2002 | Kishino |
| 2002/0078311 A1 | 6/2002 | Matsuzaki et al. |
| 2002/0080677 A1 | 6/2002 | Watanabe et al. |

(56) References Cited

U.S. PATENT DOCUMENTS

| | | |
|---|---|---|
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0213035 A1 | 10/2004 | Cavaleri et al. |
| 2004/0218431 A1 | 11/2004 | Chung et al. |
| 2005/0041502 A1 | 2/2005 | Perner |
| 2005/0105315 A1 | 5/2005 | Shin et al. |
| 2005/0243629 A1 | 11/2005 | Lee |
| 2005/0265104 A1 | 12/2005 | Remaklus et al. |
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0230264 A1 | 10/2007 | Eto |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0313494 A1 | 12/2008 | Hummler et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0057173 A1 | 3/2013 | Yao et al. |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1 | 3/2014 | Song |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0177376 A1 | 6/2014 | Song |
| 2014/0189215 A1 | 7/2014 | Kang et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0317344 A1 | 10/2014 | Kim |
| 2014/0355332 A1 | 12/2014 | Youn et al. |
| 2014/0369109 A1 | 12/2014 | Lee et al. |
| 2014/0379978 A1 | 12/2014 | Kim et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0078845 A1 | 3/2016 | Lin et al. |
| 2016/0078911 A1 | 3/2016 | Fujiwara et al. |
| 2016/0078918 A1 | 3/2016 | Hyun et al. |
| 2016/0086649 A1 | 3/2016 | Hong et al. |
| 2016/0086651 A1 | 3/2016 | Kim |
| 2016/0093402 A1 | 3/2016 | Kitagawa et al. |
| 2016/0099043 A1 | 4/2016 | Tu |

(56) References Cited

U.S. PATENT DOCUMENTS

| | | |
|---|---|---|
| 2016/0111140 A1 | 4/2016 | Joo et al. |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0224262 A1* | 8/2016 | Mandava ............ G11C 14/0009 |
| 2016/0225433 A1 | 8/2016 | Bains et al. |
| 2016/0225461 A1 | 8/2016 | Tuers et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2018/0366182 A1 | 12/2018 | Hyun et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1* | 2/2019 | Nale ................. G11C 11/40618 |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0147964 A1 | 5/2019 | Yun et al. |
| 2019/0161341 A1 | 5/2019 | Howe |
| 2019/0172518 A1 | 6/2019 | Chen et al. |
| 2019/0196730 A1 | 6/2019 | Imran |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2019/0386557 A1 | 12/2019 | Wang et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2021/0005229 A1 | 1/2021 | Hiscock et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158851 A1 | 5/2021 | Ayyapureddi et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |
| 2021/0241810 A1 | 8/2021 | Hollis et al. |
| 2021/0265504 A1 | 8/2021 | Ishizu et al. |
| 2021/0350844 A1 | 11/2021 | Morohashi et al. |
| 2021/0398592 A1 | 12/2021 | Penney et al. |
| 2021/0407583 A1 | 12/2021 | Penney et al. |
| 2022/0069992 A1 | 3/2022 | Ayyapureddi |
| 2022/0165347 A1 | 5/2022 | Pan |
| 2022/0230672 A1 | 7/2022 | Ayyapureddi et al. |
| 2022/0293166 A1 | 9/2022 | Ayyapureddi et al. |
| 2022/0415427 A1 | 12/2022 | Pan |
| 2023/0010619 A1 | 1/2023 | Ayyapureddi et al. |
| 2023/0047007 A1 | 2/2023 | Lovett |

FOREIGN PATENT DOCUMENTS

| | | |
|---|---|---|
| CN | 101038785 A | 9/2007 |
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |

(56) References Cited

FOREIGN PATENT DOCUMENTS

| | | |
|---|---|---|
| CN | 102483952 A | 5/2012 |
| CN | 104350546 A | 2/2015 |
| CN | 106710621 A | 5/2017 |
| CN | 107871516 A | 4/2018 |
| JP | H0773682 A | 3/1995 |
| JP | 2005-216429 A | 8/2005 |
| JP | 2011-258259 A | 12/2011 |
| JP | 4911510 B2 | 1/2012 |
| JP | 2013-004158 A | 1/2013 |
| KR | 20150002112 A | 1/2015 |
| KR | 20150002783 A | 1/2015 |
| KR | 20170058022 A | 5/2017 |
| KR | 1020180064940 A | 6/2018 |
| KR | 1020180085184 A | 7/2018 |
| KR | 20190048049 A | 5/2019 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020191222 A1 | 9/2020 |
| WO | 2021003085 A1 | 1/2021 |
| WO | 2022108808 A1 | 5/2022 |

OTHER PUBLICATIONS

U.S. Appl. No. 17/007,069 titled "Apparatuses and Methods for Providing Refresh Addresses" filed Aug. 31, 2020, pp. all.
U.S. Appl. No. 17/443,056 titled "Apparatuses and Methods for Multiple Row Hammer Refresh Address Sequences" filed Jul. 20, 2021, pp. all.
[English Abstract] Zheng, Bin , et al., "Design of Built-in DRAM for TFT-LCD Driver Chip LCD and display," Issue 4, Aug. 15, 2009; pp. all.
U.S. Appl. No. 17/822,033, titled, "Apparatuses and Methods for Tracking Word Line Accesses" filed Aug. 24, 2022, pp. all pages of application as filed.
U.S. Appl. No. 17/446,710 titled "Apparatuses, Systems, and Methods for Determining Extremum Numerical Values" filed Sep. 1, 2021.
U.S. Appl. No. 17/470,883 titled "Apparatuses and Methods for Tracking Victim Rows" filed Sep. 9, 2021.
U.S. Appl. No. 17/932,206, titled, "Apparatuses and Methods for Dynamically Allocated Aggressor Detection" filed Sep. 14, 2022; pp. all pages of application as filed.
U.S. Appl. No. 17/444,925 titled "Apparatuses and Methods for Countering Memory Attacks" filed Aug. 12, 2021.
U.S. Appl. No. 17/456,849 titled "Apparatuses, Systems, and Methods for Main Sketch and Slim Sketch Circuitfor Row Address Tracking" filed Nov. 29, 2021.
U.S. Appl. No. 17/565,119 titled "Apparatuses and Methods for Row Hammer Counter Mat" filed Dec. 29, 2021.
U.S. Appl. No. 17/565,187 titled "Apparatuses and Methods for Row Hammer Counter Mat" filed Dec. 29, 2021.
U.S. Appl. No. 15/884,192 entitled 'Semiconductor Device Performing Row Hammer Refresh Operation' filed Jan. 30, 2018, pp. all.
U.S. Appl. No. 16/797,658, titles "Apparatuses and Methods for Controlling Refresh Operations", filed Feb. 21, 2020, pp. all.
U.S. Appl. No. 16/818,981 titled "Apparatuses and Methods for Staggered Timing of Targeted Refresh Operations" filed Mar. 13, 2020, pp. all.
U.S. Appl. No. 16/824,460, titled "Semiconductor Device Performing Row Hammer Refresh Operation", dated Mar. 19, 2020, pp. all.
U.S. Appl. No. 16/025,844, titled "Apparatus and Methods for Triggering Row Hammer Address Sampling", filed Jul. 2, 2018, pp. all.
U.S. Appl. No. 16/783,063, titled "Apparatus and Methods for Triggering Row Hammer Address Sampling", dated Feb. 5, 2020, pp. all.
U.S. Appl. No. 16/805,197, titled "Apparatuses and Methods for Calculating Row Hammer Refresh Addresses in a Semiconductor Device", dated Feb. 28, 2020, pp. all.
U.S. Appl. No. 16/232,837, titled "Apparatuses and Methods for Distributed Targeted Refresh Operations", filed Dec. 26, 2018, pp. all.
U.S. Appl. No. 16/818,989, titled "Semiconductor Device Performing Row Hammer Refresh Operation", dated Mar. 13, 2020, pp. all.
U.S. Appl. No. 16/268,818, titled "Apparatuses and Methods for Managing Row Access Counts", filed Feb. 6, 2019, pp. all.
U.S. Appl. No. 16/286,187 titled "Apparatuses and Methods for Memory Mat Refresh Sequencing" filed Feb. 26, 2019, pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/886,284 titled "Apparatuses and Methods for Access Based Refresh Timing" filed May 28, 2020, pp. all.
U.S. Appl. No. 16/886,284, titled "Apparatuses and Methods for Access Based Refresh Timing", dated May 28, 2020, pp. all.
U.S. Appl. No. 16/358,587, titled "Semiconductor Device Having Cam That Stores Address Signals", dated Mar. 19, 2019, pp. all.
U.S. Appl. No. 16/375,716 titled "Apparatuses and Methods for Staggered Timing of Targeted Refresh Operations" filed Apr. 4, 2019; pp. all.
U.S. Appl. No. 16/936,297 titled "Apparatuses and Methods for Managing Row Access Counts" filed Jul. 22, 2020, pp. all.
U.S. Appl. No. 16/411,573 titled "Apparatuses, Systems, and Methods for a Content Addressable Memory Cell" filed May 14, 2019, pp. all.
U.S. Appl. No. 16/428,625 titled "Apparatuses and Methods for Tracking Victim Rows" filed May 31, 2019, pp. all.
U.S. Appl. No. 16/513,400 titled "Apparatuses and Methods for Tracking Row Accesses" filed Jul. 16, 2019, pp. all.
U.S. Appl. No. 17/060,403 titled "Apparatuses and Methods for Adjusting Victim Data" filed Oct. 1, 2020, pp. all.
U.S. Appl. No. 16/548,027 titled "Apparatuses, Systems, and Methods for Analog Row Access Rate Determination" filed Aug. 22, 2019, pp. all.
U.S. Appl. No. 16/549,942 titled "Apparatuses and Methods for Lossy Row Access Counting" filed Aug. 23, 2019, pp. all.
U.S. Appl. No. 16/546,152 titled "Apparatuses and Methods for Analog Row Access Tracking" filed Aug. 20, 2019, pp. all.
U.S. Appl. No. 16/549,411 titled "Apparatuses and Methods for Dynamic Refresh Allocation" filed Aug. 23, 2019, pp. all.
U.S. Appl. No. 16/655,110 titled "Apparatuses and Methods for Dynamic Targeted Refresh Steals" filed Oct. 16, 2019, pp. all.
U.S. Appl. No. 17/154,945 titled "Apparatuses, Systems, and Methods for a Content Addressable Memory Cell" filed Jan. 21, 2021, pp. all.
U.S. Appl. No. 17/170,616 titled "Apparatuses, Systems, and Methods for Analog Row Access Rate Determination" filed Feb. 8, 2021, pp. all.
U.S. Appl. No. 17/168,036 titled "Apparatuses and Methods for Analog Row Access Tracking" filed Feb. 4, 2021, pp. all.
ISR/WO dated Oct. 26, 2020 for PCT Application No. PCT/US2020/040077, pp. all.
U.S. Appl. No. 16/788,657, titled "Semiconductor Device Performing Row Hammer Refresh Operation", dated Feb. 12, 2020, pp. all.
U.S. Appl. No. 15/881,256 entitled 'Apparatuses and Methods for Detecting a Row Hammer Attack With a Bandpass Filter' filed Jan. 26, 2018, pp. all.
U.S. Appl. No. 16/425,525 titled "Apparatuses And Methods For Tracking All Row Accesses" filed May 29, 2019, pp. all.
U.S. Appl. No. 16/427,105 titled "Apparatuses And Methods For Priority Targeted Refresh Operations" filed May 30, 2019, pp. all.
U.S. Appl. No. 16/427,140 titled "Apparatuses And Methods For Tracking Row Access Counts Between Multiple Register Stacks" filed May 30, 2019, pp. all.
U.S. Appl. No. 16/437,811 titled "Apparatuses, Systems, And Methods For Determining Extremum Numerical Values" filed Jun. 11, 2019, pp. all.
U.S. Appl. No. 16/537,981 titled "Apparatuses and Methods for Controlling Targeted Refresh Rates" filed Aug. 12, 2019, pp. all.

(56) References Cited

OTHER PUBLICATIONS

U.S. Appl. No. 17/153,555 titled "Apparatuses and Methods for Dynamically Allocated Aggressor Detection" filed Jan. 20, 2021, pp. all.
U.S. Appl. No. 17/201,941 titled "Apparatuses and Methods for Sketch Circuits for Refresh Binning" filed Mar. 15, 2021, pp. all.
U.S. Appl. No. 17/301,533 titled "Semiconductor Device Having Cam That Stores Address Signals" filed Apr. 6, 2021, pp. all.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed Oct. 27, 2017; pp. all.
U.S. Appl. No. 16/012,679, titled "Apparatuses and Methods for Multiple Row Hammer Refresh Address Sequences", filed Jun. 19, 2018, pp. all.
U.S. Appl. No. 16/020,863, titled "Semiconductor Device", filed Jun. 27, 2018, pp. all.
U.S. Appl. No. 16/112,471 titled "Apparatuses and Methods for Controlling Refresh Operations" filed Aug. 24, 2018, pp. all.
U.S. Appl. No. 16/160,801, titled "Apparatuses and Methods for Selective Row Refreshes" filed Oct. 15, 2018, pp. all.
U.S. Appl. No. 16/176,932, titled "Apparatuses and Methods for Access Based Refresh Timing", filed Oct. 31, 2018, pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations" filed Dec. 21, 2018, pp. all.
U.S. Appl. No. 16/231,327 titled "Apparatuses and Methods for Selective Row Refreshes", filed Dec. 21, 2018, pp. all.
U.S. Appl. No. 16/237,291, titled "Apparatus and Methods for Refreshing Memory", filed Dec. 31, 2018, pp. all.
U.S. Appl. No. 16/290,730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.
U.S. Appl. No. 16/411,698 title "Semiconductor Device" filed May 14, 2019, pp. all.
U.S. Appl. No. 16/427,330 titled "Apparatuses and Methods for Storing Victim Row Data" filed May 30, 2019, pp. all.
U.S. Appl. No. 16/431,641 titled "Apparatuses and Methods for Controlling Steal Rates" filed Jun. 4, 2019, pp. all.
U.S. Appl. No. 16/682,606, titled "Apparatuses And Methods For Distributing Row Hammer Refresh Events Across A Memory Device", filed Nov. 13, 2019, pp. all.
U.S. Appl. No. 17/102,266, titled "Apparatuses and Methods for Tracking Word Line Accesses", dated Nov. 23, 2020, pp. all.
U.S. Appl. No. 15/876,566 entitled 'Apparatuses and Methods for Calculating Row Hammer Refresh Addresses in a Semiconductor Device' filed Jan. 22, 2018, pp. all.
U.S. Appl. No. 15/656,084, titled: Apparatuses And Methods For Targeted Refreshing Of Memory, filed July 21, 2017, pp. all.
U.S. Appl. No. 16/459,520 titled "Apparatuses and Methods for Monitoring Word Line Accesses", filed Jul. 1, 2019, pp. all.
U.S. Appl. No. 15/715,846, entitled "Semiconductor Device", filed Sep. 26, 2017, pp. all.
U.S. Appl. No. 15/888,993, entitled "Apparatuses and Methods for Controlling Refresh Operations", filed Feb. 5, 2018, pp. all.
U.S. Appl. No. 16/190,627 titled "Apparatuses and Methods for Targeted Refreshing of Memory" filed Nov. 14, 2018, pp. all.
U.S. Appl. No. 16/459,507 titled "Apparatuses and Methods for Adjusting Victim Data", filed Jul. 1, 2019, pp. all.
U.S. Appl. No. 15/281,818, entitled: "Semiconductor Device" filed Sep. 30, 2016, pp. all.
Kim, et al., "Flipping Bits in Memory Without Accessing Them: An Experimental Study of DRAM Disturbance Errors", IEEE, Jun. 2014, 12 pgs.
Stout, Thomas, et al., "Voltage Source Based Voltage-to-Time Converter", IEEE, downloaded Jul. 2020, p. All.

\* cited by examiner

APPARATUSES AND METHODS FOR MONITORING WORD LINE ACCESSES

CROSS REFERENCE TO RELATED APPLICATION(S)

This application is a continuation of U.S. patent application Ser. No. 16/459,520 on Jul. 1, 2019 and issued as U.S. Pat. No. 11,139,015 on Oct. 5, 2021. The aforementioned application, and issued patent, is incorporated herein by reference, in its entirety, for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. Typically, memory cells are arranged in an array that includes a series of rows referred to as word lines and columns referred to as bit lines. An auto-refresh operation may be carried out where the memory cells of one or more word lines are periodically refreshed to preserve data stored in the memory cells. Repeated access to a particular memory cell or group of memory cells, such as a word line, may cause an increased rate of data degradation in nearby memory cells (e.g., adjacent word lines). This repeated access is often referred to as a 'row hammer'. To preserve the data in nearby memory cells, the word lines of the nearby memory cells may need to be refreshed at a rate higher than a rate of the auto-refresh operations. Detecting row hammers and compensating for row hammers requires additional layout area and power consumption. As chip sizes continue to decrease and power demands increase, reducing the area and power required for row hammer management is desired.

DETAILED DESCRIPTION

Figure 1:
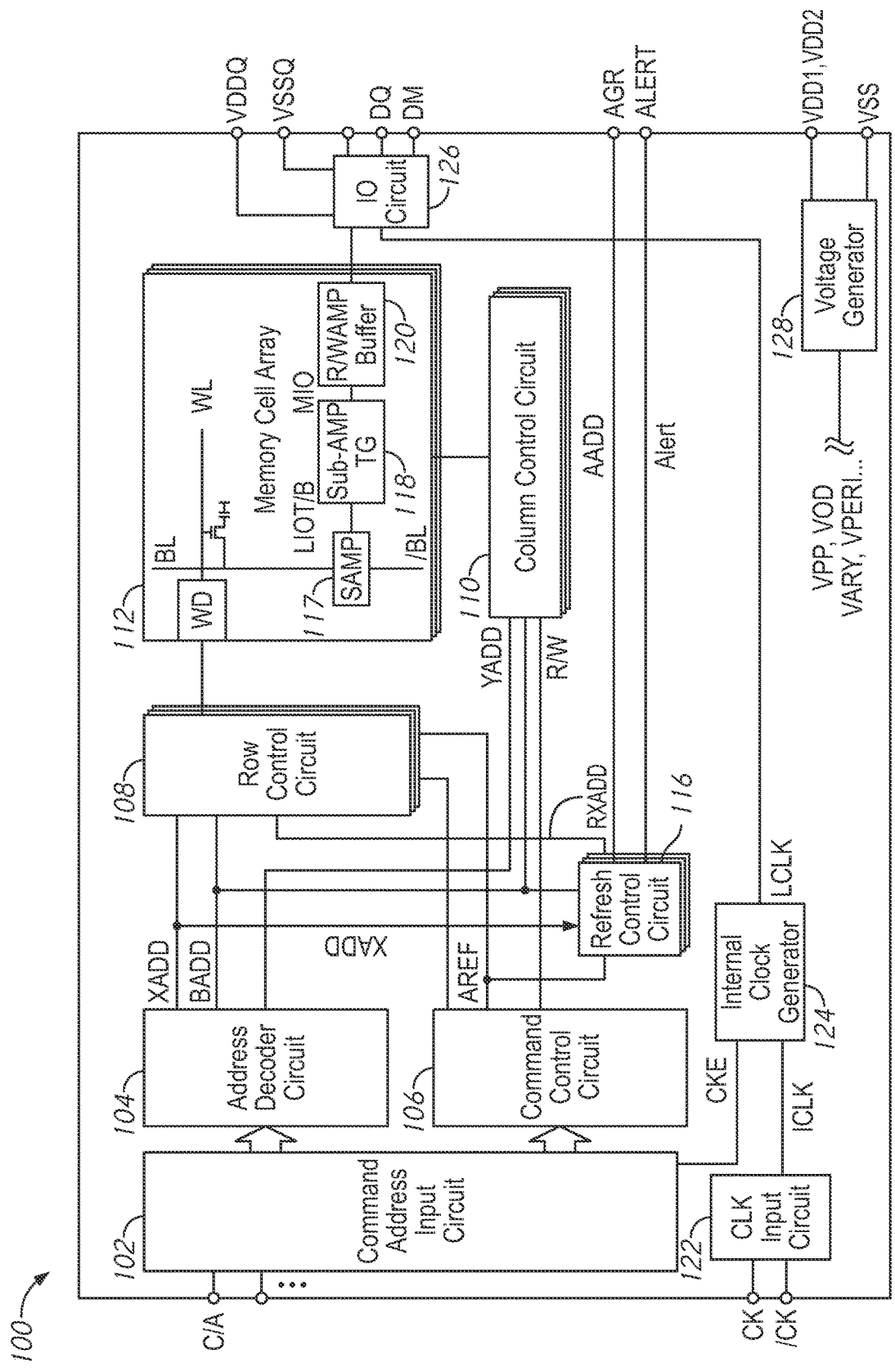
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a plurality of memory cells. The memory cells may store information (e.g., as one or more bits), and may be organized at the intersection of word lines (rows) and bit lines (columns). A number of word lines and bit lines may be organized into a memory bank. The memory device may include a number of different memory banks. The memory device may receive one or more command signals which may indicate operations in one or more of the banks of one or more memory packages. The memory device may enter a refresh mode, in which word lines in one or more of the memory banks are refreshed.

Information in the memory cells may decay over time. The memory cells may be refreshed on a row-by-row (e.g., word line-by-word line) basis to preserve information in the memory cells. During a refresh operation, the information in one or more rows may be rewritten back to the respective word line to restore an initial value of the information. Repeated access to a given word line (e.g., an aggressor word line) may cause an increased rate of information decay in one or more physically neighboring word lines (e.g., victim word lines). In some applications, victim word lines may be considered to be the word lines which are physically adjacent to the aggressor word line. For example, victim word lines may be located on either side of the aggressor word line (e.g., R+1 and R−1). In some embodiments, the word lines which are adjacent to the adjacent word lines (e.g., R+2 and R−2) may also be treated as victim word lines. In some applications, such as memories where word lines are densely spaced, more distant word lines may also be considered as victim word lines.

Accesses to different word lines of the memory may be tracked in order to determine if a word line is an aggressor word line. The row address of the accessed word lines and/or aggressor word lines may be stored in a register (e.g., file) or other storage device in the memory. If a word line is determined to be an aggressor word line, victim addresses associated with the victim word lines may be determined based, at least in part, on a row address of the aggressor word line. In some embodiments, the victim word lines (e.g., R+1, R−1, R−2, and R−2) may be refreshed as part of a targeted (or 'row hammer') refresh operation and thus there may be, for example, four victim addresses refreshed for each determined aggressor address.

An apparatus may include multiple memory devices each with multiple banks, for example, as a dual inline memory module. Each memory device may include circuitry for row hammer management (e.g., monitoring row accesses, identifying aggressor rows, identifying victim word lines, and refreshing the victim word lines) for all of the banks of that memory device. During a memory access operation (e.g., activation, read, write), the memory address provided is the same for all of the memory devices. That is, a bank address and a row address provided to all the memory devices may be the same. When a row hammer occurs, the row hammer will affect a word line having the same bank and row address for all of the memory devices of the apparatus. Thus, some or all of the row hammer management circuitry of each memory device may be performing redundant operations.

The present disclosure is drawn to apparatuses and methods for tracking accessed word lines, identifying aggressor word lines, and sharing identified aggressor word lines between memory devices in an apparatus. In some embodiments, the memory devices may each monitor word line accesses for different portions of a memory. In some cases, the different portions may be mutually exclusive. For example, each memory device may monitor word line accesses for a different bank or set of banks. However, other divisions of memory may be used. If a memory device identifies an aggressor word line in the portion of memory that the memory device is monitoring, the memory device may alert the other memory devices. The memory devices may then determine victim word lines associated with the aggressor word line and perform one or more targeted refresh operations to 'heal' the victim word lines.

Distributing row hammer management across memory devices in an apparatus may reduce the total layout area dedicated to row hammer management in the apparatus in some embodiments. Distributing the row hammer management may reduce power consumption as redundant operations may be reduced in some embodiments.

FIG. 1 is a block diagram showing an overall configuration of a semiconductor device according to at least one embodiment of the disclosure. The semiconductor device 100 may be a semiconductor memory device, such as a DRAM device integrated on a single semiconductor chip.

The semiconductor device 100 includes a memory array 112. In some embodiments, the memory array 112 may include multiple memory banks. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row control circuit 108 and the selection of the bit lines BL and /BL is performed by a column control circuit 110. In some embodiments, there may be a row control circuit 108 and column control circuit 110 for each of the memory banks.

The bit lines BL and /BL are coupled to a respective sense amplifier (SAMP) 117. Read data from the bit line BL or /BL is amplified by the sense amplifier SAMP 117, and transferred to read/write amplifiers 120 over complementary local data lines (LIOT/B), transfer gate (TG) 118, and complementary main data lines (MIO). Conversely, write data outputted from the read/write amplifiers 120 is transferred to the sense amplifier 117 over the complementary main data lines MIO, the transfer gate 118, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 122. The external clocks may be complementary. The clock input circuit 122 generates an internal clock ICLK based on the CK and /CK clocks. The ICLK clock is provided to the command control circuit 106 and to an internal clock generator circuit 124. The internal clock generator circuit 124 provides various internal clocks LCLK based on the ICLK clock. The LCLK clocks may be used for timing operation of various internal circuits. The internal data clocks LCLK are provided to the input/output circuit 126 to time operation of circuits included in the input/output circuit 126, for example, to data receivers to time the receipt of write data.

The C/A terminals may be supplied with memory addresses. The memory addresses supplied to the C/A terminals are transferred, via a command/address input circuit 102, to an address decoder circuit 104. The address decoder circuit 104 receives the address and supplies a decoded row address XADD to the row control circuit 108 and supplies a decoded column address YADD to the column control circuit 110. The row address XADD may be used to specify one or more word lines WL of the memory array 112 and the column address YADD may specify one or more bit lines BL of the memory array 112. The address decoder circuit 104 may also provide a bank address BADD, which specifies a particular bank of the memory. The bank address BADD may be provided to the row control circuit 108 and/or column control circuit 110 to direct access operations to one or more of the banks. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and/or bank address BADD to indicate the memory cell(s) to be accessed.

The commands may be provided as internal command signals to a command control circuit 106 via the command/address input circuit 102. The command control circuit 106 includes circuits to decode the internal command signals to generate various internal signals and commands for performing operations. For example, the command control circuit 106 may provide a row command signal to select a word line and a column command signal to select a bit line.

The device 100 may receive an access command which is a row activation command ACT. When the row activation command ACT is received, a row address XADD is timely supplied with the row activation command ACT.

The device 100 may receive an access command which is a read command. When a read command is received, a bank address BADI) and a column YADD address are timely supplied with the read command, read data is read from memory cells in the memory array 112 corresponding to the row address XADD and column address YADD. The read command is received by the command control circuit 106, which provides internal commands so that read data from the memory array 112 is provided to the read/write amplifiers 120. The read data is output to outside from the data terminals DQ via the input/output circuit 126.

The device 100 may receive an access command which is a write command. When the write command is received, a bank address and a column address are timely supplied with the write command, write data supplied to the data terminals DQ is written to a memory cells in the memory array 112 corresponding to the row address and column address. The write command is received by the command control circuit 106, which provides internal commands so that the write data is received by data receivers in the input/output circuit 126. Write clocks may also be provided to the external clock terminals for timing the receipt of the write data by the data receivers of the input/output circuit 126. The write data is supplied via the input/output circuit 126 to the read/write amplifiers 120, and by the read/write amplifiers 120 to the memory array 112 to be written into the memory cell MC.

The device 100 may also receive commands causing it to carry out refresh operations. A refresh signal AREF may be a pulse signal which is activated when the command control circuit 106 receives a signal which indicates a refresh command. In some embodiments, the refresh command may be externally issued to the memory device 100. In some embodiments, the refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh control circuit 116 supplies a refresh row address RXADD to the row control circuit 108, which may refresh one or more word lines WL indicated by the refresh row address RXADD. The refresh control circuit 116 may control a timing of the refresh operation based on the refresh signal AREF. In some embodiments, responsive to an activation of AREF, the refresh control circuit 116 may generate one or more activations of a pump signal, and may generate and provide a refresh address RXADD for each activation of the pump signal (e.g., each pump).

One type of refresh operation may be an auto-refresh operation. Responsive to an auto-refresh operation the memory bank may refresh a word line or a group of word lines of the memory, and then may refresh a next word line or group of word lines of the memory bank responsive to a next auto-refresh operation. The refresh control circuit 116 may provide an auto-refresh address as the refresh address RXADD which indicates a word line or a group of word lines in the memory bank. The refresh control circuit 116 may generate a sequence of refresh addresses RXADD such that over time the auto-refresh operation may cycle through all the word lines WL of the memory bank. The timing of refresh operations may be such that each word line is refreshed with a frequency based, at least in part, on a normal rate of data degradation in the memory cells (e.g., auto-refresh rate).

Another type of refresh operation may be a targeted refresh operation. As mentioned previously, repeated access to a particular word line of memory (e.g., an aggressor word line) may cause an increased rate of decay in neighboring word lines (e.g., victim word lines) due, for example, to electromagnetic coupling between the word lines. In some embodiments, the victim word lines may include word lines which are physically adjacent to the aggressor word line. In some embodiments, the victim word lines may include word lines further away from the aggressor word line. Information in the victim word line may decay at a rate such that data may be lost if they are not refreshed before the next auto-refresh operation of that word line. In order to prevent information from being lost, it may be necessary to identify aggressor word lines and then carry out a targeted refresh operation where a refresh address RXADD associated with one or more associated victim word lines is refreshed.

The refresh control circuit 116 may selectively output a targeted refresh address (e.g., a victim row address) or an automatic refresh address (e.g., auto-refresh address) as the refresh address RXADD. The auto-refresh addresses may be from a sequence of addresses which are provided based on activations of the auto-refresh signal AREF. The refresh control circuit 116 may cycle through the sequence of auto-refresh addresses at a rate determined by AREF. In some embodiments, the sequence of auto-refresh addresses may be generated by updating (e.g., incrementing) one or more portions of the previous auto-refresh address.

The refresh control circuit 116 may also determine targeted refresh addresses which are addresses that require refreshing (e.g., victim row addresses corresponding to victim word lines) based on the access pattern of nearby addresses (e.g., aggressor addresses corresponding to aggressor word lines) in the memory array 112. The refresh control circuit 116 may selectively use one or more signals of the device 100 to calculate the refresh address RXADD. For example, the refresh address RXADD may be calculated based on the row addresses XADD provided by the address decoder circuit 104. The refresh control circuit 116 may receive the current value of the row address XADD provided by the address decoder circuit 104 and determine a targeted refresh address based on one or more of the received addresses.

The refresh address RXADD may be provided with a timing based on a timing of the refresh signal AREF. The refresh control circuit 116 may have time slots corresponding to the timing of AREF, and may provide one or more refresh addresses RXADD during each time slot. In some embodiments, a targeted refresh address may be issued in a time slot which would otherwise have been assigned to an auto-refresh address (e.g., "steal"). In some embodiments, certain time slots may be reserved for targeted refresh addresses. These time slots may be referred to as a targeted refresh intervals or targeted refresh time slots. The time period between time slots reserved for targeted refresh addresses may be referred to as the targeted refresh rate or steal rate. As the number of time slots assigned to targeted refreshes increases, the steal rate increases, and the effective auto-refresh rate decreases. In some embodiments, the number of time slots assigned to targeted refreshes is constant. In some embodiments, the refresh control circuit 116 may determine whether to provide a targeted refresh address, not provide an address during that time slot, or provide an auto-refresh address instead during the time slot. Thus, in some embodiments, the steal rate may not be constant over time.

The refresh control circuit 116 may receive the bank addresses BADD and the row addresses XADD provided by the address decoder circuit 104 and may determine which word lines are being hammered based on the row addresses XADD. In some embodiments, the refresh control circuit 116 may only determine which word lines are being hammered for a particular portion of memory, for example, a bank or a group of banks. The refresh control circuit 116 may count accesses to the word lines for the particular portion of memory based, at least in part, on the row address XADD and may determine which word lines are aggressors based on the count of the accesses (e.g., reach a threshold value). The row addresses XADD and access count values may be stored by the refresh control circuit 116.

When an aggressor word line in the particular portion of the memory is determined, the refresh control circuit 116 may calculate victim word lines associated with the aggressor word line and perform targeted refresh operations as previously described. In some embodiments, when the aggressor word line is determined, the refresh control circuit 116 may activate an alert signal, which may be provided to other memory devices (not shown in FIG. 1) via an ALERT pin. Conversely, when the refresh control circuit 116 receives an active alert signal, the refresh control circuit 116 may latch a current row address XADD, even if the row address XADD does not correspond to a row address in the particular portion of memory. The refresh control circuit 116 may calculate victim word lines associated with the latched address for targeted refresh operations.

In some embodiments, in addition to or instead of activating the alert signal, the refresh control circuit 116 may provide a memory address AADD associated with the aggressor word line. The memory address AADD may include the row address and bank address of the aggressor word line in some embodiments. The memory address AADD may be provided to other memory devices via an AGR pin. Conversely, when the refresh control circuit 116 receives memory address AADD from the AGR pin, the refresh control circuit 116 may latch the memory address AADD and calculate victim word lines associated with the latched address for targeted refresh operations. Thus, while the example shown in FIG. 1 includes both the ALERT pin and the AGR pin, in some embodiments, the ALERT pin may be omitted (or used for other memory operations) and only the AGR pin may be used. However, in some embodiments, only an alert signal is used and the AGR pin may be omitted in these embodiments.

The power supply terminals are supplied with power supply potentials VDD and VSS. The power supply potentials VDD and VSS are supplied to an internal voltage generator circuit 128. The internal voltage generator circuit 128 generates various internal potentials VPP, VOD, VARY, VPERI, and the like based on the power supply potentials VDD and VSS supplied to the power supply terminals. The internal potential VPP is mainly used in the row decoder circuit 108, the internal potentials VOD and VARY are mainly used in the sense amplifiers SAMP included in the memory array 112, and the internal potential VPERI is used in many peripheral circuit blocks.

The power supply terminals are also supplied with power supply potentials VDDQ and VSSQ. The power supply potentials VDDQ and VSSQ are supplied to the input/output circuit 126. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 126 does not propagate to the other circuit blocks.

Figure 2:
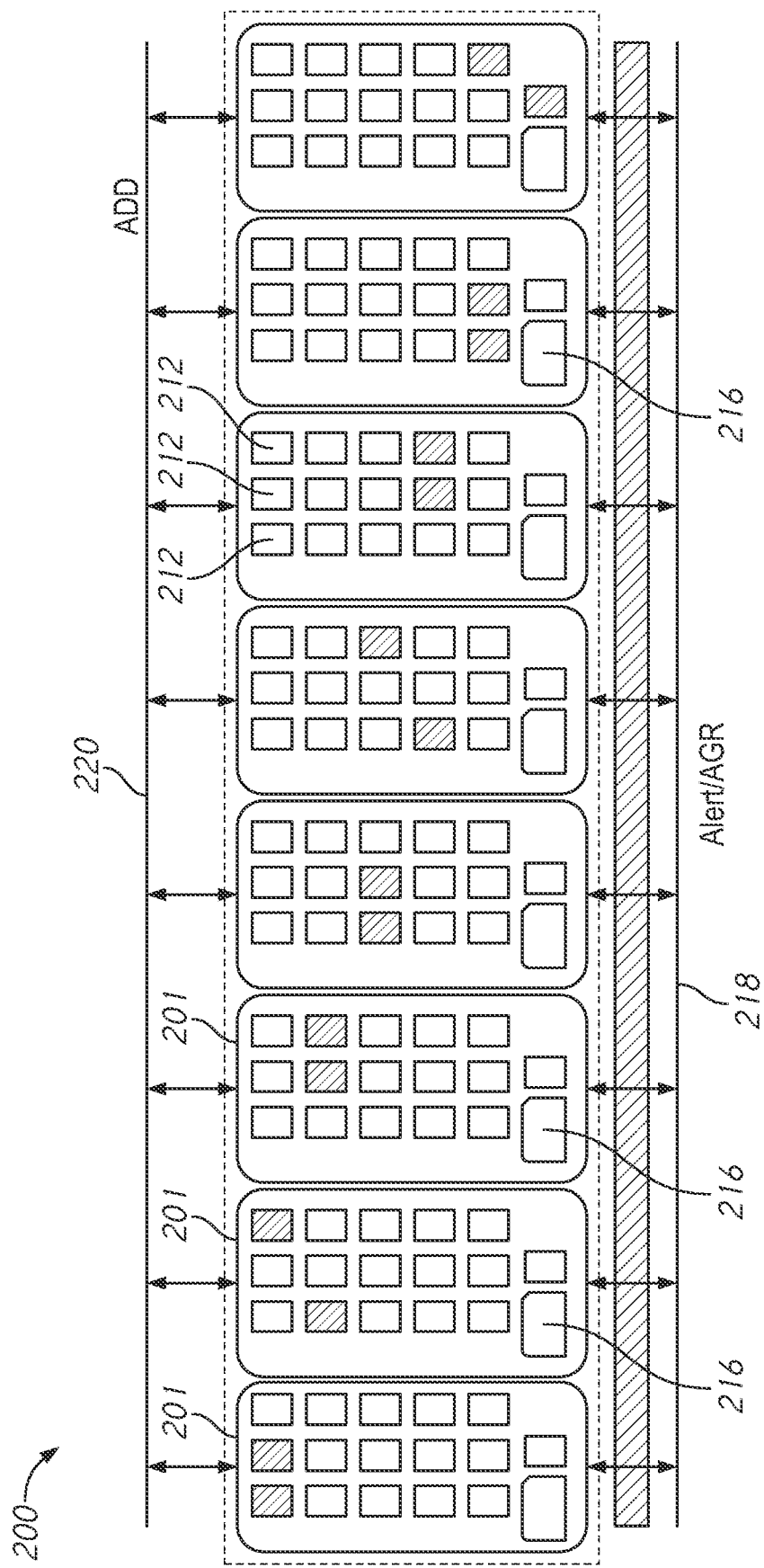
FIG. 2 is a block diagram of an apparatus including multiple memory devices according to an embodiment of the present disclosure.

FIG. 2 is a block diagram of an apparatus including multiple memory devices according to an embodiment of the present disclosure. The apparatus 200 may include multiple memory devices 201. In some embodiments, each memory device 201 may include memory device 100 shown in FIG. 1. Each memory device 201 may include a number of banks 212. Banks 212 may each include a memory array, such as memory array 112 shown in FIG. 1. Each memory device 201 may include a refresh control circuit 216. In some embodiments, refresh control circuit 216 may include refresh control circuit 116 shown in FIG. 1. In some embodiments, the memory devices 201 may be communicatively coupled by an alert line and/or aggressor address line (Alert/AGR). In some embodiments, the Alert/AGR line(s) may be coupled to each memory device 201 at an alert pin and/or AGR pin.

As shown in FIG. 2, all of the memory devices 201 may receive an address ADD on an address bus 220. All of the memory devices 201 may receive the same address ADD from the address bus 220. The address ADD may include a row address XADD and a bank address BADD in some embodiments. An address decoder (not shown in FIG. 2) on each memory device may decode the row address XADD and bank address BADD from the address ADD in some embodiments. The address ADD may indicate a word line in a bank to be accessed by the memory devices 201 as part of a memory access operation (e.g., read, write). Thus, all of the memory devices 201 may access the same word line in the same bank.

In some embodiments, the memory devices 201 may track word line accesses to determine if a row hammer is occurring. For example, the memory devices 201 may store row addresses XADD received from the address ADD on the address bus 220 and the number of times the row addresses XADD are received from the address bus 220. However, because all of the memory devices 201 receive the same address ADD, not all of memory devices 201 are required track and/or store all of the row addresses XADD received from the address bus 220. Instead, row hammer management (e.g., tracking and storing row addresses) may be distributed across the memory devices 201 such that each memory device 201 monitors a portion of the addresses ADD received for row hammer events. For example, each memory device 201 may monitor row addresses XADD associated with certain bank addresses BADD. When a memory device 201 determines a row hammer event is occurring in the portion of the memory the memory device 201 is responsible for monitoring, the memory device 201 alerts the other memory devices 201. Then, as described in more detail below, all of the memory devices 201 can take action to mitigate the row hammer (e.g., heal victim rows) based on the alert.

In some embodiments, the refresh control circuits 216 of the memory devices 201 may monitor row address accesses to determine if a row hammer is occurring in one or more banks. For example, the refresh control circuits 216 may receive and store row addresses provided by an address decoder circuit (not shown in FIG. 2) and count a number of times each row address is accessed. If a row address is accessed a sufficient number of times or a sufficient number of times within a given time period, the row address may be identified as an aggressor row. Each refresh control circuit 216 may monitor the row addresses for only a portion of the memory device 201. In the example shown in FIG. 2, each refresh control circuit 216 monitors two banks 212 as indicated by the shaded boxes. When any of the refresh control circuits 216 identify an aggressor row in their respective monitored banks 212, the refresh control circuit 216 alerts the other refresh control circuits 216. In some embodiments, the refresh control circuit 216 may activate an alert signal on the alert line. In some embodiments, the refresh control circuit 216 may provide the aggressor address on the aggressor address line. In some embodiments, the refresh control circuit 216 may activate both the alert signal and transmit the aggressor address.

Based on the alert signal and/or aggressor address, all of the memory devices 201 may perform targeted refresh operations on victim word lines of an aggressor word line associated with the aggressor address. Thus, effects of a row hammer can be mitigated in any bank 212 on a memory device 201, even for banks 212 that are not monitored by the particular memory device 201.

Although eight memory devices 201 are shown, the apparatus 200 may include more or fewer memory devices 201 (e.g., 4, 16). Furthermore, although each memory device 201 is shown including sixteen banks 212, each memory device 201 may include more or fewer banks (e.g., 8, 32). The size of the portion of memory monitored by each memory device 201 may be based, at least in part, on a number of banks and the number of memory devices 201. In the example shown in FIG. 2, each of the eight memory devices 201 must monitor two banks 212 to ensure the entire memory is monitored for row hammers. If the apparatus 200 included sixteen memory devices, each memory device would only need to monitor one bank 212. In some applications, some redundancy of monitoring may be desired. In these cases, the memory portions monitored by each memory device 201 may not be mutually exclusive. For example, in FIG. 2, each memory device 201 could monitor four banks 212 so that each bank 212 is monitored by two memory devices 201. Furthermore, if there are more memory devices 201 than banks 212, each memory device 201 may monitor less than one bank 212 in some embodiments. In some embodiments, if there are more memory devices 201 than banks 212, some memory devices 201 may not perform any tracking and only respond to alerts from other memory devices 201.

In this manner the circuitry and computations for row hammer management may be distributed across the multiple memory devices 201 in the apparatus 200. This may reduce the total layout area in the apparatus 200 dedicated to row hammer management circuitry in some embodiments. For example, if row hammer events are monitored by storing row addresses received from the address bus 220, less storage may be required as each memory device 201 does not need storage for monitoring all of the row addresses of the memory. The distributed row hammer management may also reduce power consumption in some embodiments. For example, each memory device 201 does not need to increment count values or compare count values to a threshold for every row address in the memory.

Figure 3:
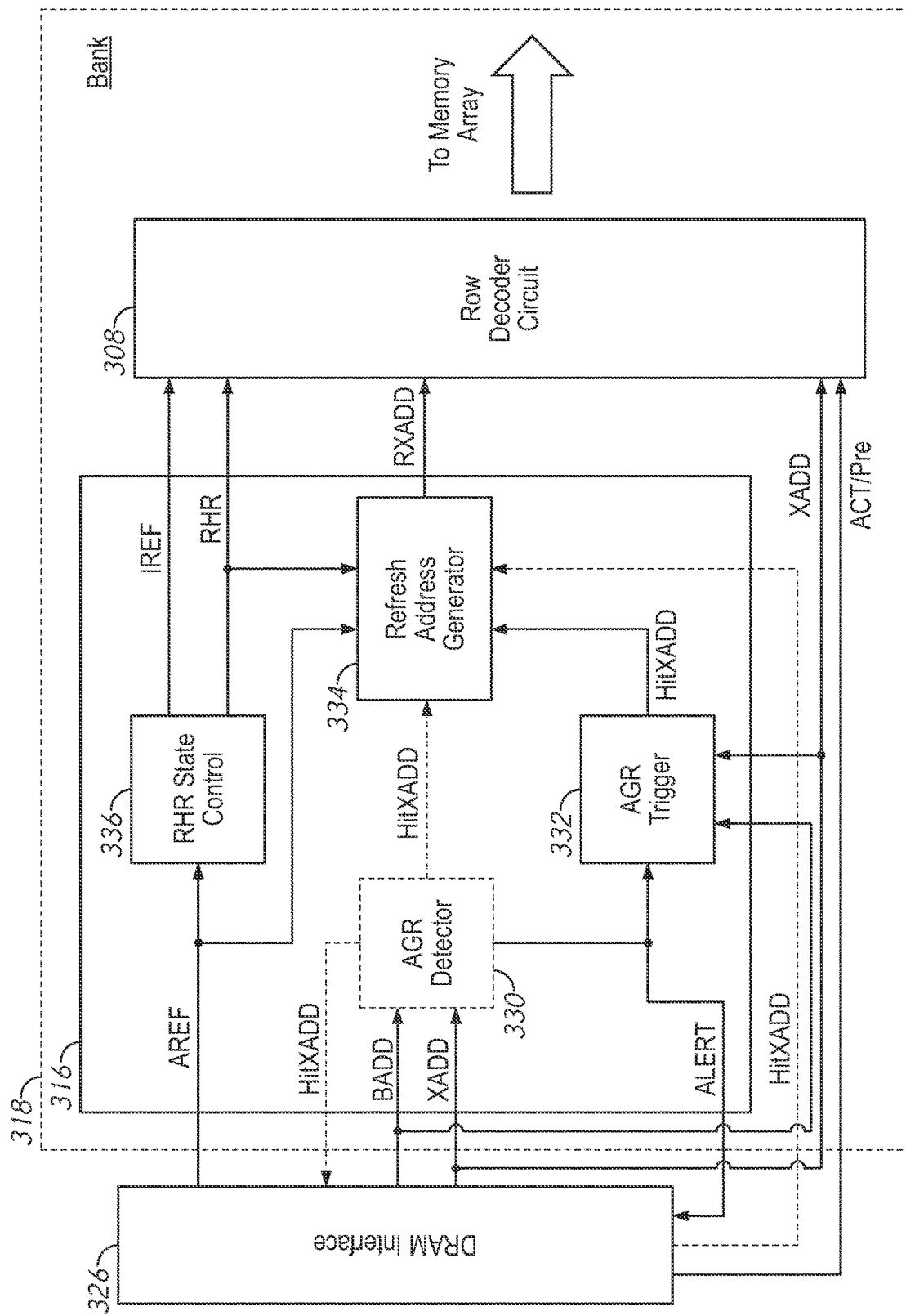
FIG. 3 is a block diagram of a refresh control circuit according to an embodiment of the present disclosure.

FIG. 3 is a block diagram of a refresh control circuit according to an embodiment of the present disclosure. In some embodiments, the refresh control circuit may be included in a memory device and the memory device may be included in an apparatus including multiple memory devices, such as apparatus 200 and memory devices 201 shown in FIG. 2. The dashed line is shown to represent that in certain embodiments, each of the components (e.g., the refresh control circuit 316 and row decoder circuit 308) may be provided for a particular bank 318 of memory, and that these components may be repeated for each of the banks of memory. In some embodiments, one or more of the components shown within the dashed line may be associated with each of the memory banks 318. Thus, there may be multiple refresh control circuits 316 and row decoder circuits 308. For the sake of brevity, only components for a single bank will be described. In some embodiments, memory bank 318 may be included in memory bank 112 shown in FIG. 1 and/or memory bank 212 shown in FIG. 2. In some embodiments, refresh control circuit 316 may be included in refresh control circuit 116 shown in FIG. 1 and/or refresh control circuit 216 shown in FIG. 2. In some embodiments, row decoder circuit 308 may be included in row control circuit 108.

A DRAM interface 326 may provide one or more signals to an address refresh control circuit 316 and row decoder circuit 308. The refresh control circuit 316 may include an aggressor row detector circuit (AGR detector) 330, an aggressor row (AGR) trigger 332, a refresh address generator 334, and a row hammer refresh (REM) state control 336. The DRAM interface 326 may provide one or more control signals, such as an auto-refresh signal AREF, and a row address XADD.

The DRAM interface 326 may represent one or more components which provides signals to components of the bank 318. In some embodiments, the DRAM interface 326 may represent a memory controller coupled to the semiconductor memory device device 100 of FIG. 1). In some embodiments, the DRAM interface 326 may represent components such as the command address input circuit 102, the address decoder circuit 104, and/or the command control circuit 106 of FIG. 1. The DRAM interface 326 may provide a row address XADD, the auto-refresh signal AREF, an activation signal ACT, a precharge signal Pre, and an alert signal ALERT. The auto-refresh signal AREF may be a periodic signal which may indicate when an auto-refresh operation is to occur. The activation signal ACT may be provided to activate a given bank 318 of the memory. The row address XADD may be a signal including multiple bits (which may be transmitted in series or in parallel) and may correspond to a specific row of a memory bank (e.g., the memory bank activated by ACT/Pre). The alert signal may be provided to and from other memory devices in an apparatus including the refresh control circuit 316.

While the AGR detector 330 may be included in the refresh control circuit 316, in some embodiments, only one of the refresh control circuits 316 of a memory device may include the AGR detector 330, thus it is indicated in dashed lines. In some embodiments, the AGR detector 330 may be provided outside the refresh control circuit 316 and coupled to all of the refresh control circuits 316 of each bank 318. The AGR detector 330 may be "assigned" to a bank by a fuse, antifuse, and/or programmable logic.

During a memory operation, the AGR detector 330 may receive the current bank address BADD and row address XADD. In some embodiments, the AGR detector 330 may store the current value of the row address XADD if the current bank address BADD corresponds to the one or more banks assigned to the memory device for row hammer management. If the current bank address BADD does not correspond to the assigned bank, the AGR detector 330 may ignore the current row address XADD. For example, if the memory device including refresh control circuit 316 is assigned to monitor BANK4, the AGR detector 330 will ignore a row address associated with bank addresses BADD for BANK2. The AGR detector 330 does not need to be physically located in the refresh control circuit 316 associated with the bank the AGR detector 330 is assigned to monitor. The AGR detector 330 may further store a count value associated with each stored row address. The count value for a row address may be adjusted (e.g., incremented) each time the row address stored in the AGR detector 330 is received as XADD.

For each row address XADD stored in the AGR detector 330, the AGR detector 330 may determine if the current row address XADD is an aggressor address based on one or more previously stored row addresses. For example, in some embodiments, the AGR detector 330 may determine a row address is an aggressor address based on a number of times the row address XADD is received (e.g., the count value of the stored row address exceeds a threshold value). In some embodiments, the AGR detector 330 may activate the alert signal ALERT, which may be provided to the DRAM interface 326 to be provided to other memory devices. The AGR detector 330 may then reset the count value associated with the aggressor address. In some embodiments, the alert signal ALERT may be provided as a one-bit signal on a pin coupled in common to the memory devices.

In some embodiments, the alert signal may also be provided to the AGR trigger 332. Responsive to an active alert signal, the AGR trigger 332 may latch the current row address XADD and bank address BADD. The latched address may correspond to the row address determined to be an aggressor address by the AGR detector 330 or by another AGR detector in another memory device of the apparatus. The AGR trigger 332 may provide the aggressor address to the refresh address generator 334 as the matched address HitXADD. The match address HitXADD may represent an aggressor word line. Thus, the AGR detector 330 provides the active alert signal to the AGR trigger 332 and other memory devices while the identified aggressor address is still the current row address XADD and bank address BADD.

Optionally, in some embodiments, in addition to activing the alert signal or instead of activating the alert signal, the AGR detector 330 may provide the matched address HitXADD to the refresh address generator 334 rather than the AGR trigger 332. In these embodiments, matched address HitXADD may be provided on a signal line internal to the memory device including the AGR detector 330 and the refresh address generator 334. Furthermore, in these embodiments, the AGR trigger 332 may only provide aggressor addresses detected by other memory devices to the refresh address generator 334.

In other embodiments, the AGR detector 330 may provide the matched address HitXADD to the DRAM interface 326 to be provided to the other memory devices. Further, the DRAM interface 326 may provide matched addresses HitXADD from other memory devices to the refresh address generator 334. In these embodiments, the matched address HitXADD provided to or received from other memory devices may correspond to aggressor address AADD provided via AGR pin shown in FIG. 1. In these embodiments, the AGR trigger 332 and/or alert signal may be omitted. While providing the aggressor address AADD/HitXADD to other memory devices may require providing more data and/or an additional line between memory devices, in some embodiments, providing the aggressor address may allow more flexibility with signal timing compared to activating the ALERT signal and latching XADD and BADD.

The row address XADD may change as the DRAM interface 326 directs access operations (e.g., read and write operations) to different rows of the memory cell array (e.g., memory cell array 118 of FIG. 1). In some embodiments, the AGR detector 330 may store every received row address XADD associated with a designated bank address BADD. In other embodiments, the AGR detector 330 may store received row addresses responsive to an active sample signal provided by a sample timing generator (not shown). In some embodiments, the sample signal may be a pulse signal. That is, it may transition to an active state and return to an inactive state after a time period (e.g., half a clock cycle, one clock cycle). The sample generator may regularly, randomly, or pseudo-randomly vary a time interval between pulses of the sample signal.

The RHR state control 336 may control the timing of targeted refresh operations. The RHR state control 336 may provide the row hammer refresh signal RHR to indicate that a targeted refresh (e.g., a refresh of the victim rows corresponding to an identified aggressor row) should occur. The RHR state control 336 may also provide an internal refresh signal IREF, to indicate that an auto-refresh should occur. Responsive to an activation of RHR, the refresh address generator 334 may provide a refresh address RXADD, which may be an auto-refresh address or may be one or more victim addresses corresponding to victim word lines of the aggressor word line corresponding to the match address HitXADD. The row decoder circuit 308 may perform a targeted refresh operation responsive to the refresh address RXADD and the row hammer refresh signal RHR. The row decoder circuit 308 may perform an auto-refresh operation based on the refresh address RXADD and the internal refresh signal IREF. In some embodiments, the row decoder circuit 308 may receive the auto-refresh signal AREF provided by the DRAM interface 326, and the internal refresh signal IREF may not be used.

The RHR state control 336 may receive the auto-refresh signal AREF and provide the row hammer refresh signal RHR and the internal refresh signal IREF. The auto-refresh signal AREF may be periodically generated and may be used to control the timing of refresh operations. The memory device may carry out a sequence of auto-refresh operations in order to periodically refresh the rows of the memory device. The RHR signal may be generated in order to indicate that a particular targeted row address should be refreshed instead of an address from the sequence of auto-refresh addresses. For example, if an access count value associated with a row address XADD has reached or exceeded a threshold value. The RHR state control 336 may use internal logic to provide the RHR signal. In some embodiments, the RHR state control 336 may provide the RHR signal based on certain number of activations of AREF (e.g., every $4^{th}$ activation of AREF). The RIM state control 336 may also provide an internal refresh signal IREF, which may indicate that an auto-refresh operation should take place. In some embodiments, the signals RHR and IREF may be generated such that they are not active at the same time are not both at a high logic level at the same time).

The refresh address generator 334 provides either an auto-refresh address or a victim row address based on match address HitXADD as the refresh address RXADD. The refresh address generator 334 may determine the value of the refresh address RXADD based, at least in part, on the row hammer refresh signal RHR. In some embodiments, when the signal RHR is not active, the refresh address generator 334 may provide one of a sequence of auto-refresh addresses. When the signal RHR is active, the refresh address generator 334 may provide the victim row address as the refresh address RXADD.

The refresh address generator 334 calculates one or more victim row addresses to be refreshed based on aggressor addresses identified by the AGR detector 330 (e.g, row addresses XADD associated with count values above a threshold value). The refresh address generator 334 may receive the match address HitXADD and provide a one or more victim row in response. The victim row address may be an address for a memory location (e.g., a word line) that may be affected by repeated activation of the word line corresponding to the match address HitXADD. Different calculations may be used for generating different victim addresses as the targeted refresh address HitXADD1.

The refresh address generator 334 may employ different calculations to determine victim row addresses. In one example, the calculations may provide victim row addresses corresponding to word lines which have a known physical relationship (e.g., a spatial relationship) with a word line corresponding to the match address HitXADD. The calculations may result in a single victim row address in some embodiments of the disclosure. The calculations may result in a sequence of victim row addresses in other embodiments of the disclosure.

In one embodiment, the calculation may cause the refresh address generator to generate a pair of addresses which correspond to word lines that are adjacent to the word line corresponding to the match address HitXADD (e.g., HitXADD+/−1). In another embodiment, the calculation may cause the refresh address generator 234 to output HitXADD+/−1 as well as a pair of addresses which correspond to word lines that are adjacent to word lines corresponding to the addresses HitXADD+/−1 (e.g., HitXADD+/−2). Other calculations are possible in other example embodiments. In some embodiments, the refresh address generator 334 may store the generated victim row addresses in a queue to be provided as RXADD during subsequent targeted refresh operations.

The row decoder circuit 308 may perform one or more operations on the memory array (not shown) based on the received signals and addresses. For example, responsive to the activation signal ACT and the row address XADD (and IREF and RHR being at a low logic level), the row decoder circuit 308 may direct one or more access operations (for example, a read operation) on the specified row address XADD. Responsive to the RHR signal being active, the row decoder circuit 308 may refresh the refresh address RXADD.

Figure 4:
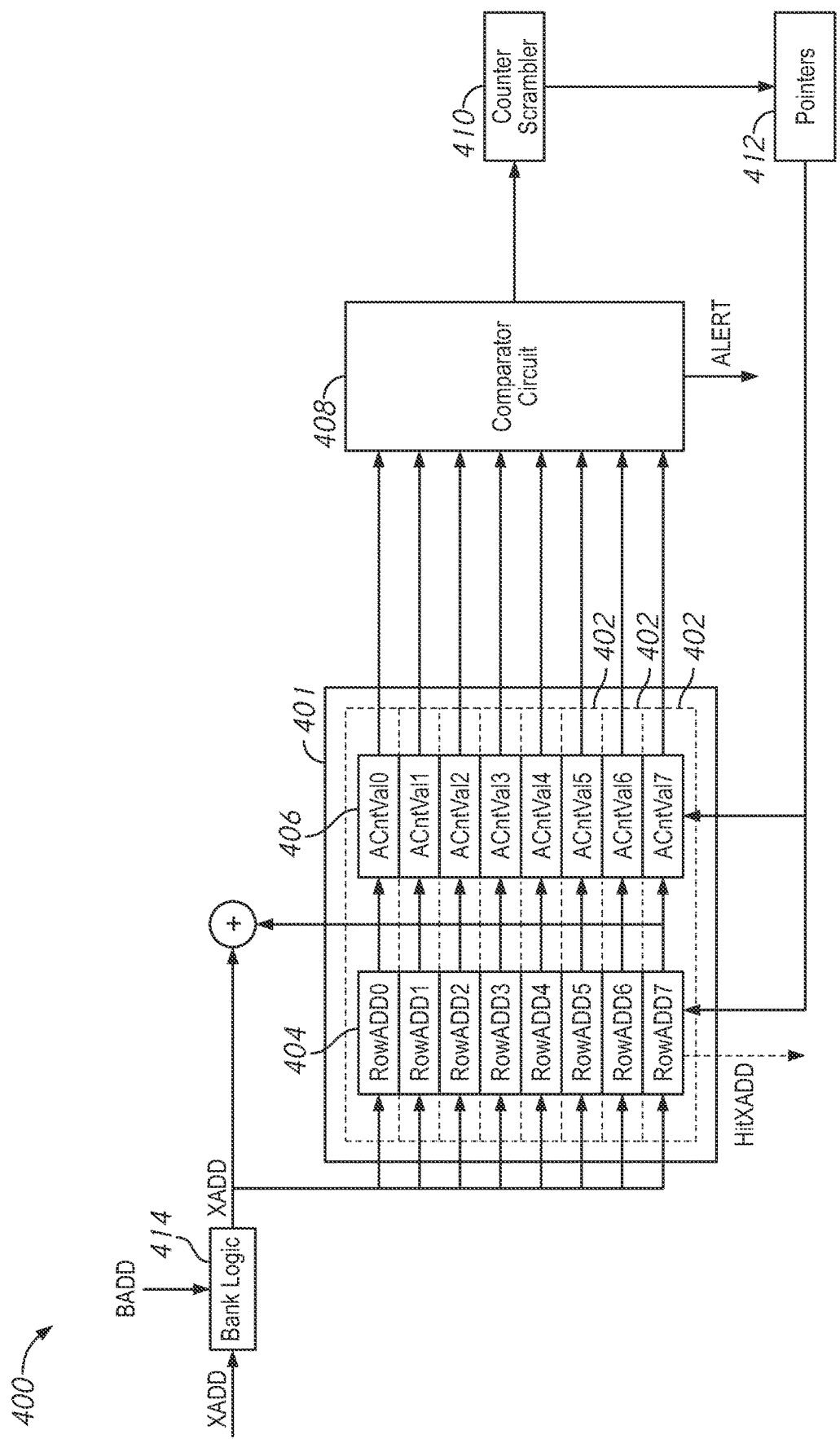
FIG. 4 is a block diagram of an aggressor row detector circuit according to an embodiment of the present disclosure.

FIG. 4 is a block diagram of an aggressor row detector circuit (AGR detector) according to an embodiment of the present disclosure. In some embodiments, the AGR detector 400 may be included in AGR detector 330 of FIG. 3. The AGR detector 400 may include a content addressable memory (CAM) stack 401 in some embodiments. In other embodiments, other data storage types may be used to implement the stack 401. The stack 401 may include multiple registers (e.g., files) 402, each of which may have corresponding fields 404, 406. In the embodiment shown in FIG. 4, each register includes a field 404 configured to store a row address (RowADD0-7) and a field 406 configured to store a corresponding count value (ACntVal0-7). The fields 406 storing the count values may be coupled to a comparator 408 which may be coupled to pointers 412 through a counter scrambler 410. In some embodiments, the fields 404 storing row addresses may be coupled to a refresh address generator (not shown in FIG. 4), such as refresh address generator 334 shown in FIG. 3, and provide a matched address HitXADD to the address generator. While the example in FIG. 4 shows eight registers 402 in the stack 401, it is understood that the stack could include fewer or more registers. For example, the stack 401 could have 128 registers. In another example, the stack 401 could have 1,024 registers.

Row addresses XADD and bank addresses BADD may be provided to a bank logic circuit 414. The bank logic circuit 414 may compare each bank address BADD to an assigned bank address. The bank address may be assigned via fuses, programmed into a register, or other method. If the bank address BADD does not match the assigned bank address, in some embodiments, the bank logic circuit 414 may mask or block the row address XADD from being provided to the registers 402. In some embodiments, the bank logic circuit 414 may provide a control signal to the registers 402 that causes the registers 402 to ignore the row address XADD. If the bank address matches the assigned bank address, the bank logic circuit 414 may provide the row address XADD to the registers 402 for storage and analysis. In some embodiments, the bank logic circuit 414 may provide a control signal to the registers 402 to analyze and/or store the row address XADD.

Each time a row address XADD with a matching bank address is provided to the registers 402, the row address XADD may be compared to the fields 404. If the current row address XADD is already stored in one of the registers 402, then the count value in field 406 associated with the matching row address in field 404 may be adjusted (e.g., increased). If the current row address XADD is not already stored in one of the registers 402, it may be added to the registers 402. If there is an open register (e.g., a register without a row address) then the row address XADD may be stored in the open register. If there is not an open register, then the register 402 associated with the count value which has the lowest value (as indicated by the pointers 412) may have its row address replaced with the current row address XADD and count value reset.

In embodiments where tracking row addresses is apportioned within the memory device in units other than banks, the bank logic circuit 414 may alternatively and/or additionally receive a portion of the row address XADD or other memory address that indicates the partitions.

The comparator 408 may compare the count values in fields 406 to a threshold value to determine if a count value for a row address has matched or exceeded the threshold value (e.g., 2,000, 3,000, 5,000). In some embodiments, the comparator 408 may further compare the count values to determine which row address is associated with the lowest count value. The fields 406 corresponding to the minimum count value and count values that meet or exceed the threshold value may be provided to a counter scrambler 410, which may match the above threshold value fields and minimum count value field to their respective associated row address fields 404. The pointers 412 may point to the row addresses in fields 404 associated with count values at or above the threshold value and may point to the fields 404 associated with the minimum count value in fields 406. The threshold value pointer(s) may be used to reset the counts of the row addresses determined to be aggressors. In some embodiments, the threshold value pointer(s) may be used to provide the corresponding row address(es) to the refresh address generator as HitXADD. The minimum count value pointer may be used to overwrite a register 402 when a new row address XADD is received and there is no open register 402 to store it in.

In some embodiments, when the comparator 408 determines a count value has exceeded the threshold value, the comparator 408 may activate an ALERT signal. The ALERT signal may be provided to one or more AGR triggers, such as AGR trigger 332 shown in FIG. 3. The AGR triggers may be located on a memory device including the AGR detector 400 and/or other memory devices. The active ALERT signal may cause the AGR trigger to latch the current row address XADD and bank address BADD. Thus, the AGR detector 400 may determine a row address XADD is an aggressor address and activate the ALERT signal while the aggressor address is still the current row address XADD and bank address BADD.

In some embodiments, when the comparator 408 determines a count value has exceeded the threshold value, a row address with the threshold value pointer may be provided by the registers 402 as match address HitXADD. In the embodiment shown in FIG. 4, the stack 401 only stores the row address XADD. However, since in this example the stack 401 only stores the row addresses XADD for a particular bank, the bank address BADD may be programmed into the AUR detector 400 to be added to match address HitXADD. In other embodiments, the current bank address BADD may be latched by the bank logic 414 and appended to the row address provided by the stack 401 to generate match address HitXADD. In other embodiments, the bank address BADD may be stored in the stack 401 in addition to the row address XADD in field 404 or as an additional field (not shown in FIG. 4). The match address HitXADD may be provided to one or more refresh address generators, such as refresh address generator 334 in FIG. 3. The refresh address generators may be located on a memory device including the AGR detector 400 and/or other memory devices. The refresh address generator may generate victim row addresses for targeted refresh operations based on the match address HitXADD as described previously in reference to FIG. 3.

As discussed previously accesses to different rows of the memory may be tracked in order to determine victims and refresh them as part of a targeted refresh operation. However, individually tracking every row access may be difficult due to space and/or power limitations of the device, even when only a portion of the memory is monitored. Accordingly, in some embodiments, accesses to groups of word lines within the portion of memory may be tracked rather than individual word lines. This may further reduce the amount of storage (e.g., number of registers) required for adequate tracking on a memory device.

Figure 5:
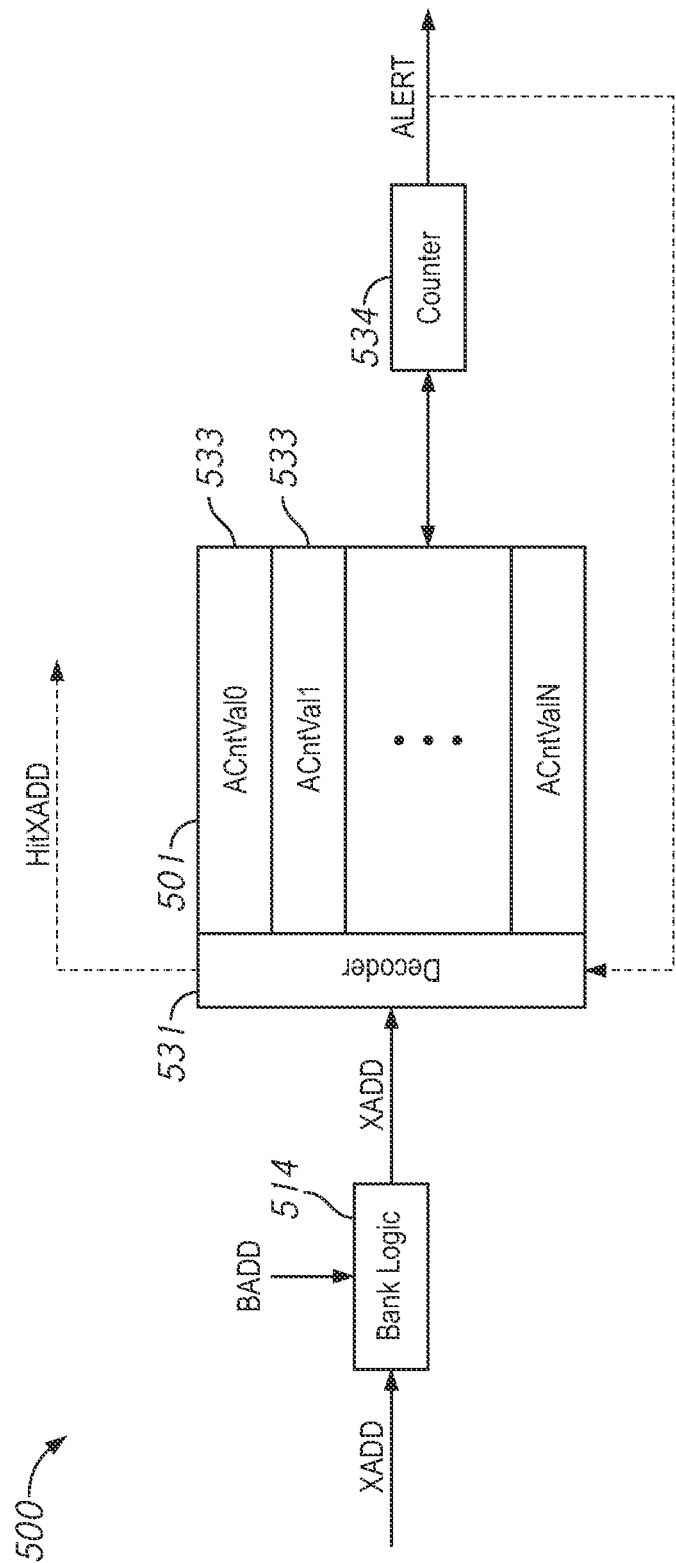
FIG. 5 is a block diagram of an aggressor row detector circuit according to an embodiment of the present disclosure.

FIG. 5 is a block diagram of an aggressor row detector circuit (AGR detector) according to an embodiment of the present disclosure. In some embodiments, the AGR detector 500 may be included in AGR detector 330 of FIG. 3. The AGR detector 500 may include a content addressable memory (CAM) stack 501, which may include a plurality of registers 533, each of which may store a count value ACntVal0-N, in some embodiments. The AGR detector 500 may include a bank logic circuit 514, a decoder 531, and a counter circuit 534.

Row addresses XADD and bank addresses BADD may be provided to a bank logic circuit 514. The bank logic circuit 514 may compare each bank address BADD to an assigned bank address. The bank address may be assigned via fuses, programmed into a register, or other method. If the bank address BADD does not match the assigned bank address, in some embodiments, the bank logic circuit 514 may mask or block the row address XADD from being provided to the decoder 531. In some embodiments, the bank logic circuit 514 may provide a control signal to the decoder 531 that causes the decoder 531 to ignore the row address XADD. If the bank address matches the assigned bank address, the bank logic circuit 514 may provide the row address XADD to the decoder 531 to analyze and/or store. In some embodiments, the bank logic circuit 514 may provide a control signal to the decoder 531 to analyze and/or store the row address XADD.

Each register (or 'file') 533 of the stack 501 may include a number of latch circuits, each of which may store a bit of information. Together, the bits of each register may represent a number in binary. The number of bits used to represent the count value (e.g., the width of the registers) may be based on a threshold value. In some embodiments, each register may include 12 latch circuits, and thus the count value may be stored as a 12 bit number a number from 0 to 4,095))). Other widths of the registers may be used in other example embodiments.

The decoder 531 may receive the row address XADD and provide one of the count values from the stack 501 to the counter logic circuit 534 based on a value of a subset of the bits of the row address XADD. Each of the count values of the stack 501 may be associated with a portion of the word lines of the memory, for example, a subset of the word lines in a bank assigned to be monitored by the stack 501. Each portion of the word lines may be specified by a value of the subset of the bits of the row address XADD. Each of the count values may be associated with a particular value of the subset of the bits of the row address. Thus, there may be a first count value for a first value of the subset of the row address (e.g., ACntVal0), a second count value for a second value of the subset of the row address (e.g., ACntVal1), etc. If the subset of the row address has N possible values, then the row count stack 501 may be N registers deep.

For example, in some embodiments the row address may be 17 bits long to represent 2^17 total word lines in a hank (not including the redundant word lines). The fourth through sixteenth bits (e.g., RA3-16) may be a section address which represents a particular section of the memory, with each section containing 8 word lines, which are addressed by the first through third bits (e.g., RA0-RA2) as a word line address. The decoder 531 may group some of the sections together by ignoring some of the bits of the section address, which may be considered to be a multi-section address. For example the decoder 531 may only pay attention to a multi-section address including the fourth through thirteenth bits of the row address (e.g., RA3-RA12) such that each multi-section address represents sixteen of the sections. Each count value in the stack 501 may be associated with a value of the multi-section address (e.g., RA3-RA12). Thus the stack 501 may be 1024 registers 'deep', one for each of the values of the multi-section address RA3-RA12 (e.g., 2^10 total values). Each count value in such a stack may represent eight word lines (since the word line address is ignored) in each of 16 different sections of the memory (since the section address is truncated into a multi-section address). Thus, in this example embodiment, each count value represents 128 total word lines. Different organizations of the memory and the row address may be used in other examples. In other embodiments, the row address may have more (or fewer) bits to represent more or fewer word lines of a memory.

Each register 533 of the stack 501 contains a count value which is associated with multiple word lines of the memory array. Whenever the row address XADD indicates that any of those word lines have been accessed, the count value may be provided to the counter logic circuit 534. The counter logic circuit 534 may update the count value, for example by incrementing the count value. The counter logic circuit 534 may also compare the updated count value to a threshold. If the count value is less than or equal to the threshold, then the incremented count value may be written back to the register 533. If the count value is greater than the threshold, then in some embodiments, the counter logic circuit 534 may provide an active ALERT signal and may reset the count value to a minimum value (e.g., 0) before rewriting the count value to the register 533.

Responsive to the active ALERT signal provided by the counter logic circuit 534, one or more AGR triggers, such as AGR trigger 332 shown in FIG. 3, may latch the current row address XADD and bank address BADD and provide it to a corresponding refresh address generator, such as refresh address generator 334 shown in FIG. 3. The refresh address generator may determine and provide victim addresses based on the row address XADD (e.g., the same row address that caused the active ALERT signal to be provided). The refresh address generator may only receive (and/or only pay attention to) a subset of the bits of the row address XADD. In some embodiments, the refresh address generator may use the same subset of the row address as the stack 501. For example, the refresh address generator may determine the victim addresses based on the multi-section address including the fourth through thirteenth bits of the row address (e.g., RA3-RA12). The refresh address generator may provide a number of victim addresses which include victim addresses associated with all of the word lines represented by the subset of the row address. In some embodiments, each victim address may represent multiple word lines of the memory, and all of the word lines represented by a given victim address may be refreshed simultaneously. In some embodiments, the refresh address generator may also provide victim addresses which represent word lines not associated with the portion of the row address.

In some embodiments, in addition to or instead of proving the active ALERT signal to an AGR trigger, the counter circuit 534 may provide the active ALERT signal as a control signal to the decoder 531. In response to the active ALERT signal, the decoder 531 may provide the portion of the row address and bank address BADD associated with the count value that was just reset as matched address HitXADD. The matched address HitXADD may include a subset of the bits of the row address associated with the reset count value. HitXADD may be provided to one or more refresh address generators for generating victim rows as described previously.

The embodiment shown in FIG. 5 may reduce the number of registers required in the stack 501. The embodiment shown in FIG. 5 may reduce a number of fields per register as only count values, not row addresses, are stored in the registers.

Figure 6:
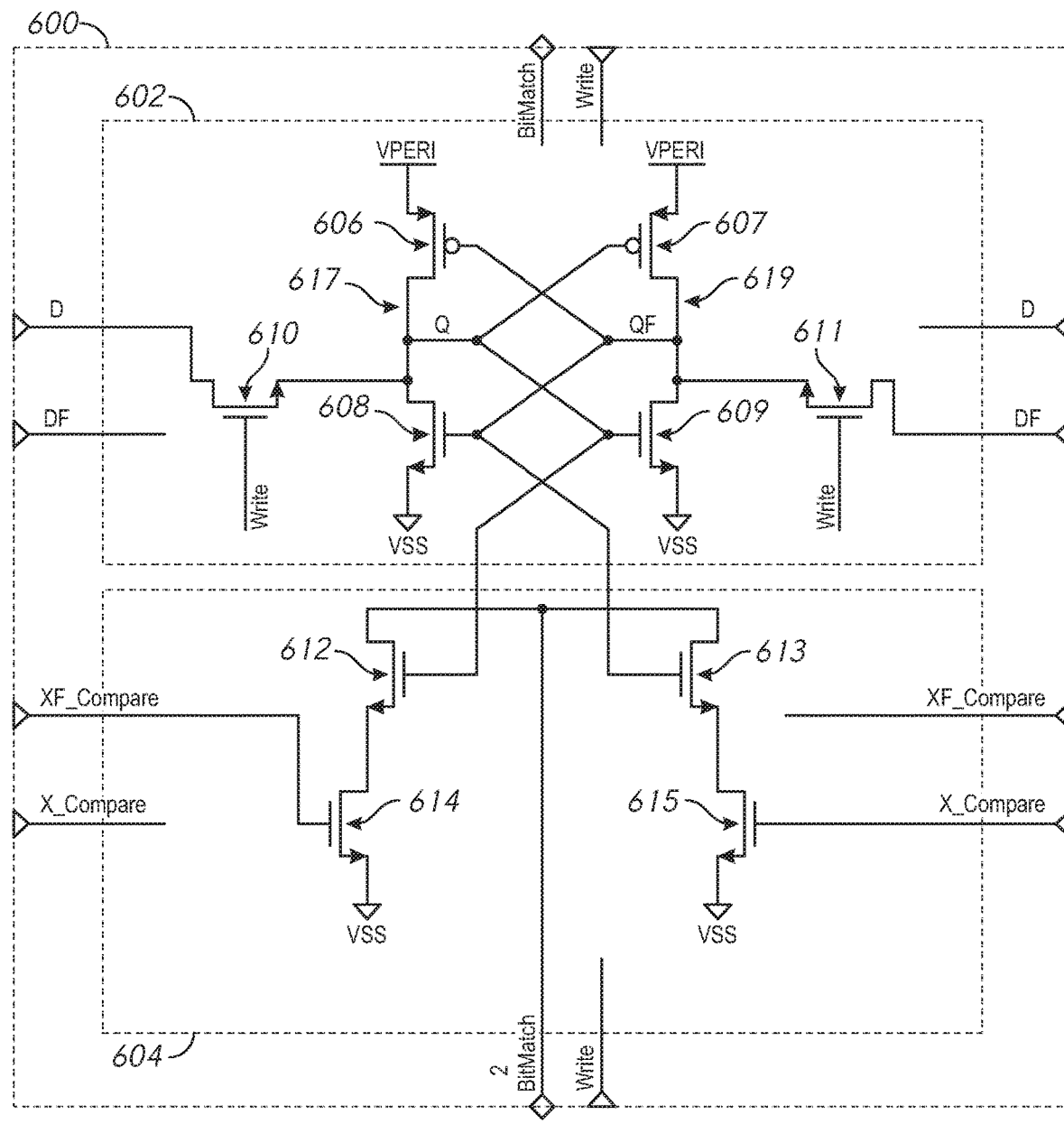
FIG. 6 is a schematic diagram of a content addressable memory cell according to an embodiment of the disclosure.

FIG. 6 is a diagram of a content addressable memory (CAM) cell according to an embodiment of the present disclosure. In some embodiments, the CAM cell 600 may be included in a stack, such as stack 401 shown in FIG. 4, and/or stack 501 shown in FIG. 5. In some embodiments, the CAM cell 600 may be included in a register, such as registers 402 shown in FIG. 4 and/or registers 533 shown in FIG. 5. A register may include multiple CAM cells 600. A register may include a CAM cell for every bit stored in the register. For example, a register may include a CAM cell for each bit of a victim row address and each bit of a count value. A stack may include multiple registers that include CAM cells.

The CAM cell 600 includes a latch portion 602 and a comparator portion 604. The CAM cell 600 may generally use voltages to represent the values of various bits. The CAM cell 600 may include conductive elements (e.g., nodes, conductive lines) which carry a voltage representing a logical value of that bit. For example, a high logical level may be represented by a first voltage (e.g., a system voltage such as VPERI), while a low logical level may be represented by a second voltage (e.g., a ground voltage, such as VSS).

The latch portion 602 includes a first transistor 606 which has a source coupled to a node which provides a voltage VPERI, which may represent a high logical level. The first transistor 606 has a drain coupled to a node 617 having a voltage which represents the value of the signal Q and a gate coupled to a node 619 having a voltage which represents a value of the complementary signal QF. The signal Q represents the logical level of a bit stored in the latch portion 602. The first transistor 606 may be a p-type transistor. The latch portion 602 also includes a second transistor 607 which has a source coupled to the node which provides VPERI, a gate coupled to the node 617 and a drain coupled to the node 619. The second transistor 607 may be a p-type transistor.

The latch portion 602 includes a third transistor 608 which has a drain coupled to the node 617, a gate coupled to the node 619, and a source coupled to a node providing a ground voltage VSS, which may represent a low logical level. The third transistor 608 may be an n-type transistor. The latch portion 602 includes a fourth transistor 609 which has a drain coupled to the node 619, a gate coupled to the node 617, and a source coupled to the node providing the ground voltage VSS. The fourth transistor 609 may be an n-type transistor. The transistors 606 and 608 may form an inverter circuit and the transistors 607 and 609 may form another inverter circuit, and the two inverter circuits are cross-coupled to one another.

In operation, the first, second, third, and fourth transistors 606-609 may work to store the value of the stored signals Q and QF. The transistors 606-609 may work together to couple the node 617 carrying Q and the node 619 carrying QF to a node providing the system voltage (e.g., VPERI or VSS) associated with the value of the signals Q and QF. For example, if the stored signal Q is at a high logical level, then the inverse signal QF is at a low logical level. The first transistor 606 may be active, and VPERI may be coupled to the node 617. The second transistor 607 and the third transistor 608 may be inactive. The fourth transistor 609 may be active and may couple VSS to the node 619. This may keep the node 617 at a voltage of VPERI, which represents a high logical level, and the node 619 at a voltage of VSS, which represents a low logical level. In another example, if the stored signal Q is at a low logical level, then the inverse signal QF may be at a high logical level. The first transistor 606 and the fourth transistor 609 may both be inactive. The second transistor 607 may be active and may couple VPERI to the node 619. The third transistor 608 may also be active and may couple VSS to the node 617. In this manner, the stored signal Q and QF may be coupled to a respective system voltage corresponding to their current logical levels, which may maintain the current logical value of the stored bit.

The latch portion 602 also includes a fifth transistor 610 and a sixth transistor 611. The transistors 610 and 611 may act as switches which may couple a signal line which carries input data. D and a signal line carrying inverse input data DF to the nodes 617 and 619 carrying Q and QF respectively when a write signal Write is active. The fifth transistor 610 has a gate coupled to a line carrying the Write signal, a drain coupled to the signal D, and a source coupled to the node 619. The sixth transistor 611 has a gate coupled to the Write signal, a drain coupled to the signal DF, and a source coupled to the node 619. Accordingly, when the Write signal is at a high level (e.g., at a voltage such as VPERI), the transistors 610 and 611 may be active, and the voltages of the signals D and DF may be coupled to the nodes 617 and 619 carrying Q and QF respectively.

In some embodiments, the first through sixth transistors 606-611 may generally all be the same size as each other.

The CAM cell 600 also includes a comparator portion 604. The comparator portion 604 may compare the signals Q and QF to the signals X_Compare and XF_Compare. The signal X_Compare may represent a logical level of an external bit provided to the comparator portion 604. If there is not a match between the signals Q and X_Compare (and therefore between QF and XF_Compare), then the comparator portion 604 may change a state of from the BitMatch signal from a first logical level (e.g., a high logical level) to a second logical level (e.g., a low logical level). For example, if the stored and external bits do not match, the comparator portion 604 may couple the ground voltage VSS to a signal line carrying the signal BitMatch. In some embodiments, if there is a match between the stored and external bits, then the comparator portion 604 may do nothing. In some embodiments, the signal BitMatch may be precharged to a voltage associated with a high logical level (e.g., VPERI) before a comparison operation.

The comparator portion includes a seventh transistor 612, an eighth transistors 613, a ninth transistor 614, and a tenth transistor 615. The seventh transistor 612 includes a drain coupled to the signal BitMatch, a gate coupled to the node 617 (e.g., the signal Q), and a source coupled to a drain of the ninth transistor 614. The ninth transistor 614 also has a gate coupled to the signal XF_Compare and a source coupled to a signal line providing the ground voltage VSS.

The eighth transistor 613 has a drain coupled to the signal BitMatch, a gate coupled to the node 619 (e.g., the signal QF), and a source coupled to a drain of the tenth transistor 615. The tenth transistor has a gate coupled to the signal X_Compare and a source coupled to the ground voltage VSS.

Since the signal Q is complementary to the signal QF, the comparator portion 602 may operate by comparing the external signal X_Compare to the signal QF to see if they match, and the inverse external signal XF_Compare to the stored signal Q to see if they match. If they do match, it may indicate that the signal X_Compare does not match the signal Q and that the signal XF_Compare does not match the signal QF, and thus that the external bits do not match the associated stored bits.

The comparator portion 604 may use relatively few components, since it changes the signal BitMatch from a known state (e.g., a precharged high logical level) to a low logical level. Thus, it may not be necessary to include additional components (e.g., additional transistors) to change the logical level of the signal BitMatch from low to high, or from an unknown level to either low or high. The comparator portion 604 may take advantage of this to provide dynamic logic. For example, the comparator portion 604 has two portions (e.g., transistors 612/614 and transistors 614/615) either of which may couple the signal Mine to the voltage VSS if there is not a match between the stored and external bit. Since only one of the portions is active at a time, only the state of the signal Q or QF needs to be checked by the active portion. Either of the portions is equally capable of changing the signal BitMatch to a low logical level.

In an example operation, if the stored signal Q is at a high logical level (and thus the signal QF is low) and the external signal X_Compare is also high (and the signal XF_Compare is low), then the external signals may match the stored signals, and the transistors 612 and 615 may be active while the transistors 614 and 613 are inactive. This may prevent the ground voltage VSS from being coupled to the signal BitMatch. If the signal X_Compare is low (e.g., if there is not a match), then the external signals may not match the stored signals, and the transistors 612 and 614 may be active wile transistors 613 and 615 are inactive. The transistors 612 and 614 being active at the same time may couple the ground voltage VSS to the signal BitMatch.

In another example operation if the stored signal Q is low (and thus the signal QF is high) then the transistor 612 may be inactive while the transistor 613 is active. If the external signal X_Compare is low (and XF_compare is high) then the external signal may match the stored bits, and the transistor 614 is active while transistor 615 is inactive. If the signal X_Compare is high (and the signal XF_Compare is low) then the external signal may not match the stored signal and the transistor 614 may be inactive while the transistor 615 is active. Accordingly, the signal BitMatch may be coupled to ground voltage VSS through active transistors 613 and 615.

In some embodiments, the transistors 612-615 of the comparator portion 604 may generally all have the same size to each other. In some embodiments, the transistors 612-615 of the comparator portion 604 may be a different size than the transistors 606-611 of the latch portions 602.

Figure 7:
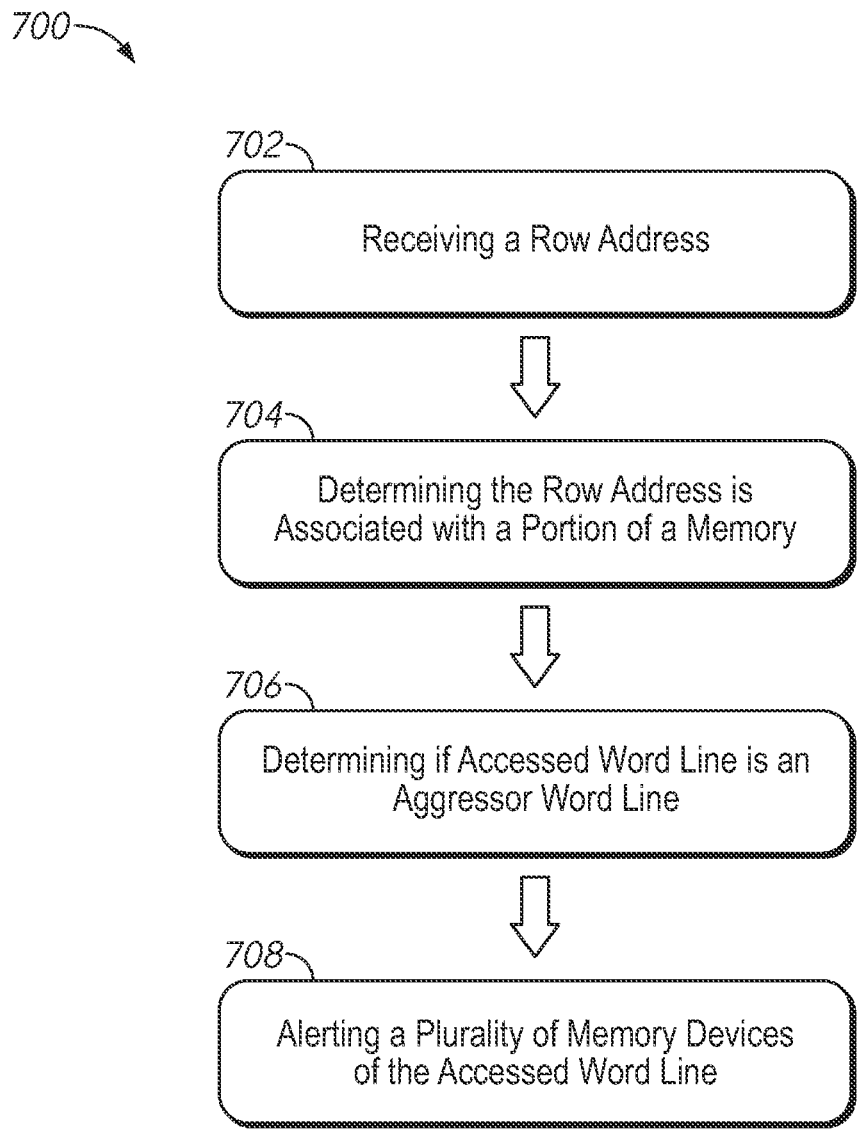
FIG. 7 is a flow chart of a method according to an embodiment of the disclosure.

FIG. 7 is a flowchart 700 of a method according to an embodiment of the present disclosure. In some embodiments, the method shown in flowchart 700 may be performed by the devices and apparatuses described herein, for example the device 100 shown in FIG. 1, the devices 201 shown in FIG. 2. The devices and apparatuses described herein may include the refresh control circuit 316 shown in FIG. 3, which may perform the method shown in flowchart 700 in some embodiments.

At block 702, a step of "receiving a row address," may be performed. In some embodiments, the row address may correspond to an accessed word line. In some embodiments, the row address may be received at a AGR detector, such as AGR detector 330 shown in FIG. 3, AGR detector 400 shown in FIG. 4, and/or AGR detector 500 shown in FIG. 5.

At block 704, a step of "determining the row address is associated with a portion of a memory," may be performed. The portion of the memory may correspond to a bank in some embodiments. In some embodiments, the portion of the memory may be the portion of the memory assigned to the aggressor row detector circuit to monitor. In some embodiments, the assignment may be made by an "assignment" fuse set comparison. In some embodiments, the assignment fuse or fuses may be blown after module assembly of the memory and/or portion of the memory.

At block 706, a step of "determining if the accessed word line is an aggressor word line" may be performed. In some embodiments, block 706 may only be performed if the row address is associated with the portion of the memory as determined in block 704. In some embodiments, if the row address is not associated with the portion of the memory, the row address may be ignored and the method shown in FIG. 7 may end. In some embodiments, the word line may be determined to be an aggressor word line if a count value associated with the word line meets or exceeds a threshold value. In some embodiments, the aggressor row detector circuit may store row addresses associated with the portion of memory and count values associated with each row address. The count values may correspond to a number of times the row addresses have been accessed. In some embodiments, the aggressor row detector circuit may only store count values and include a row decoder for determining with row address or row addresses correspond to the count values.

At block 708, a step of "alerting a plurality of memory devices of the accessed word line" may be performed. Block 708 may only be performed if the accessed word line is determined to be the aggressor word line at block 706. If the access word line is not determined to be an aggressor word line, the method of FIG. 7 may end.

In some embodiments, alerting may include providing an active alert signal to the plurality of memory devices. In some embodiments, the alert signal may be provided by the aggressor row detector circuit. In some embodiments, the alert signal may be received by an aggressor address trigger. When alerting includes providing an active alert signal, the method shown in FIG. 7 may further include latching the row address and bank address and calculating at least one victim row address associated with the row address. The victim row addresses may correspond to word lines that are victims of the aggressor word line. The victim word lines may then be refreshed by targeted refresh operations in some embodiments.

In some embodiments, the alerting may include providing the row address and bank address associated with the aggressor word line. In some embodiments, the row address may be received by a refresh address generator. When alerting includes providing the row and bank address, the method shown in FIG. 7 may further include calculating at least one victim row address associated with the row address. At least one victim word line associated with the victim row address may then be refreshed by a targeted refresh operation in some embodiments.

The devices, apparatuses, and methods described herein may provide for distributing row hammer management across memory devices in an apparatus in some embodiments. This may reduce the total layout area dedicated to row hammer management in the apparatus in some embodiments. Distributing the row hammer management may reduce power consumption as redundant operations may be reduced in some embodiments.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a plurality of memory devices, wherein at least one of the plurality of memory devices includes:
  a memory; and
  an aggressor row trigger configured to receive an alert signal provided by a different one of the plurality of memory devices, wherein the aggressor row trigger is configured to latch a current row address responsive to the alert signal.

2. The apparatus of claim 1, wherein the at least one of the plurality of memory devices further comprises a refresh address generator configured to generate at least one refresh address based, at least in part, on the current row address latched by the aggressor row trigger.

3. The apparatus of claim 2, wherein the at least one memory device is configured to perform a refresh operation on at least one word line of the memory corresponding to the at least one refresh address.

4. The apparatus of claim 2, wherein the at least one refresh address corresponds to a victim word line of an aggressor word line associated with the current row address.

5. The apparatus of claim 1, wherein the different one of the plurality of memory devices comprises:
a second memory; and
an aggressor row detector circuit configured to monitor word lines accessed in a portion of the second memory, determine if a word line in the portion of the second memory is an aggressor word line, and alert the at least one of the plurality of memory devices when the aggressor word line is determined.

6. The apparatus of claim 5, wherein the at least one of the plurality of memory devices further comprises:
an aggressor row detector circuit configured to monitor word lines accessed in a portion of the memory, determine if a word line in the portion of the memory is an aggressor word line, and alert at least another one of the plurality of memory devices when the aggressor word line is determined, wherein the portion of the memory is different than the portion of the second memory.

7. The apparatus of claim 6, wherein the portion of the memory and the portion of the second memory correspond to different banks of the memory and the second memory.

8. An apparatus comprising:
a first memory device; and
a second memory device comprising a refresh address generator configured to calculate a victim row address associated with an aggressor row address, wherein the aggressor row address is received from the first memory device.

9. The apparatus of claim 8, wherein the second memory device further comprises a refresh state control circuit configured to provide a control signal to the refresh address generator, wherein the refresh address generator is configured to provide the victim row address for a refresh operation when the control signal is in a first state and provide an auto-refresh address when the control signal is in a second state.

10. The apparatus of claim 8, further comprising a third memory device comprising a second refresh address generator configured to calculate a second victim row address associated with the aggressor row address, wherein the aggressor row address is received from the first memory device.

11. The apparatus of claim 10, wherein the victim row address calculated by the refresh address generator and the second victim row address generated by, the second refresh address generator are associated with a same bank number of the second memory, device and the third memory device.

12. The apparatus of claim 7, wherein the first memory device and the second memory device are coupled by an alert line, wherein the first memory device provides the aggressor row address to the second memory device via the alert line.

13. The apparatus of claim 7, further comprising a third memory device, wherein the refresh address generator of the second memory device is further configured to calculate a second victim row address associated with a second aggressor row address, wherein the second aggressor row address is received from the second memory device.

14. The apparatus of claim 13, wherein the victim row address and the second victim row address correspond to word lines in different portions of the memory device.

15. A method comprising:
    receiving at a first memory device, an alert signal received from a second memory device, wherein the alert signal indicates detection of an aggressor row address;
    responsive to the alert signal, at the first memory device, calculating at least one victim row address associated with the aggressor row address; and
    refreshing at least one word line associated with the victim row address.

16. The method of claim 15, wherein the alert signal comprises the aggressor row address.

17. The method of claim 15, further comprising:
    responsive to the alert signal, at the first memory device, latching a current row address, wherein the current row address corresponds to the aggressor row address.

18. The method of claim 15, further comprising:
    receiving at the first memory device, a second alert signal received from a third memory device, wherein the alert signal indicates detection of a second aggressor row address, wherein the second row address is associated with a word line in a different portion of the first memory device than the aggressor row address.

19. The method of claim 18, further comprising:
    responsive to the alert signal, at the first memory device, calculating at least one second victim row address associated with the second aggressor row address; and
    refreshing at least one second word line associated with the second victim row address.

20. The method of claim 15, further comprising:
    receiving a row address at the first memory device;
    determining with the first memory device, the row address is associated with a portion of the memory device;
    determining with the first memory device, whether the row address is an aggressor row address when the row address is associated with the portion of the memory; and
    alerting with the first memory device the second memory device when the row address is determined to be the aggressor row address.

* * * * *